United States Patent
Tanaka et al.

(10) Patent No.: US 8,902,018 B2
(45) Date of Patent: Dec. 2, 2014

(54) METHOD FOR CONTROLLING INTER-COMPONENT PHASE DIFFERENCE SOLITON AND INTER-COMPONENT PHASE DIFFERENCE SOLITON CIRCUIT DEVICE

(75) Inventors: Yasumoto Tanaka, Tsukuba (JP); Akira Iyo, Tsukuba (JP); Dilip Shivagan, Tsukuba (JP); Parasharam Shirage, Tsukuba (JP); Kazuyasu Tokiwa, Tokyo (JP); Tsuneo Watanabe, Koganei (JP); Norio Terada, Kagoshima (JP)

(73) Assignees: National Institute of Advanced Industrial Science and Technology, Tokyo (JP); Kagoshima University, Kagoshima-shi (JP)

( * ) Notice: Subject to any disclaimer, the term of this patent is extended or adjusted under 35 U.S.C. 154(b) by 1106 days.

(21) Appl. No.: 12/920,212

(22) PCT Filed: Feb. 20, 2009

(86) PCT No.: PCT/JP2009/053617
§ 371 (c)(1),
(2), (4) Date: Dec. 3, 2010

(87) PCT Pub. No.: WO2009/107756
PCT Pub. Date: Sep. 3, 2009

(65) Prior Publication Data
US 2011/0063016 A1  Mar. 17, 2011

(30) Foreign Application Priority Data
Feb. 29, 2008 (JP) ................ 2008-049605

(51) Int. Cl.
*H01L 39/00* (2006.01)
*H01L 39/22* (2006.01)

(52) U.S. Cl.
CPC ........... *H01L 39/223* (2013.01); *H01L 39/228* (2013.01)
USPC ...................................... 333/99 S; 333/100

(58) Field of Classification Search
CPC ...... H01L 39/22; H01L 39/223; H01L 39/228
USPC .................................. 333/20, 24 R, 99 S, 100
See application file for complete search history.

(56) References Cited

U.S. PATENT DOCUMENTS 3,676,718 A * 7/1972 Anderson et al. ............... 326/4
3,936,677 A * 2/1976 Fulton et al. .................... 327/528

(Continued)

FOREIGN PATENT DOCUMENTS

| JP | 57-63871 | 4/1982 |
|---|---|---|
| JP | 61-224374 | 10/1986 |

(Continued)

OTHER PUBLICATIONS

Y. Tanaka, "Soliton in Two-Band Superconductor", Physical Review Letters, vol. 88, No. 1, Jan. 7, 2002, pp. 017002-1 to 017002-3.

(Continued)

*Primary Examiner* — Dean O Takaoka
*Assistant Examiner* — Alan Wong
(74) *Attorney, Agent, or Firm* — Oblon, Spivak, McClelland, Maier & Neustadt, L.L.P.

(57) ABSTRACT

A control method is proposed that controls inter-component phase difference solitons by using splitting or fusion caused by the interaction between inter-component phase difference solitons themselves, without the need for application of external energy. By using a line structure (10) in which an inter-component phase difference soliton propagation line through which an inter-component phase difference soliton (So) which can exist in a superconducting environment can travel is divided into a plurality of branch lines (10-1 and 10-2) at least at a branch end (Po) set in the middle of the line, an inter-component phase difference soliton (So) in a main line (10M) which is an undivided line portion is allowed to be split and to enter the plurality of branch lines (10-1 and 10-2) without a supply of external energy, or inter-component phase difference solitons (So1 and So2) in the respective branch lines (10-1 and 10-2) are fused together without a supply of external energy, whereby an inter-component phase difference soliton (So) is allowed to propagate through the main line (10M).

9 Claims, 4 Drawing Sheets

(56) References Cited

U.S. PATENT DOCUMENTS

| | | | |
|---|---|---|---|
| 4,361,768 A | | 11/1982 | Rajeevakumar |
| 4,749,888 A | * | 6/1988 | Sakai et al. ............ 326/4 |
| 6,728,131 B2 | * | 4/2004 | Ustinov ............ 365/162 |
| 7,522,078 B2 | * | 4/2009 | Tanaka et al. ............ 341/133 |
| 2008/0051291 A1 | | 2/2008 | Tanaka et al. |

FOREIGN PATENT DOCUMENTS

| | | |
|---|---|---|
| JP | 2003-209301 | 7/2003 |
| JP | 2005-85971 | 3/2005 |
| JP | 2008-53597 | 3/2008 |

OTHER PUBLICATIONS

A. Gurevich, et al., "Interband Phase Modes and Nonequilibrium Soliton Structures in Two-Gap Superconductors", Physical Review Letters, vol. 90, No. 4, Jan. 31, 2003, pp. 047004-1 to 047004-4.

Yasumoto Tanaka, et al., "Interpretation of Abnormal AC Loss Peak Based on Vortex-Molecule Model for a Multicomponent Cuprate Superconductor", Japanese Journal of Applied Physics, vol. 46, No. 1, 2007, pp. 134-145.

Hendrik Bluhm, et al., "Magnetic Response of Mesoscopic Superconducting Rings with Two Order Parameters", Physical Review Letters, vol. 97, Dec. 8, 2006, pp. 237002-1 to 237002-4.

Toshimitsu Shioka, et al., "SQUID Microscope", Japanese Journal of Applied Physics, vol. 70, No. 1, 2001, pp. 50-52 (with partial English translation).

A. Gurevich, et al., "Phase Textures Induced by dc-Current Pair Breaking in Weakly Coupled Multilayer Structures and Two-Gap Superconductors", Physical Review Letters, vol. 97, Sep. 29, 2006, pp. 137003-1 to 137003-4.

International Search Report issued May 19, 2009 in PCT/JP2009/053617.

* cited by examiner

US 8,902,018 B2

METHOD FOR CONTROLLING INTER-COMPONENT PHASE DIFFERENCE SOLITON AND INTER-COMPONENT PHASE DIFFERENCE SOLITON CIRCUIT DEVICE

TECHNICAL FIELD

The present invention relates to a method for controlling inter-component phase difference solitons which can exist in a superconducting environment, and an inter-component phase difference soliton circuit device for implementing various functions by the control.

BACKGROUND ART

Superconducting electronics that utilizes a phase difference between a plurality of superconducting components using a multi-band superconductor is disclosed in, for example, the following Documents 1 and 2 in which the inventors of the present invention, etc., are involved.

Document 1: Japanese Patent Application Laid-Open No. 2003-209301

Document 2: Japanese Patent Application Laid-Open No. 2005-085971

In the disclosed superconducting electronics, a bit which is the basic component of computing is composed using an inter-component phase difference soliton. The development of efficient soliton generation and detection method is the fundamental technology for such electronics. Note that in the case in which a propagation line is a multi-band superconductor line, the inter-component phase difference soliton is, in particular, often called an interband phase difference soliton as a narrower concept thereof, but in the present specification inter-component phase difference solitons are hereinafter generically referred to and may be simply abbreviated as "solitons".

Meanwhile, for the generation of solitons, there are proposed a method in which a boundary condition for generating solitons is created by a magnetic field, as disclosed in the above-described Documents 1 and 2 and the following Document 3, and a method in which a nonequilibrium current is allowed to flow through a superconductor and a soliton is created together with the current, as disclosed in the following Document 4. Generation of solitons by a magnetic field is experimentally verified in the following Documents 5 and 6.

Document 3; "Soliton in Two-Band Superconductor", Y. Tanaka, Physical Review Letters, Vol. 88, Number 1, 017002

Document 4: "Interband Phase Modes and Nonequilibrium Soliton Structures in Two-Gap Superconductors", A. Gurevich and V. M. Vinokur, Physical Review Letters, Vol. 90, Number 4, 047004

Document 5: "Interpretation of Abnormal AC Loss Peak Based on Vortex-Molecule Model for a Multicomponent Cuprate Superconductor", Y. Tanaka, A. Crisan, D. D. Shivagan, A. Iyo, K. Tokiwa, and T. Watanabe, Japanese Journal of Applied Physics, Vol. 46, No. 1, 2007, pp. 134-145

Document 6: "Magnetic Response of Mesoscopic Superconducting Rings with Two Order Parameters", H. Bluhm, N. C. Koshnick, M. E. Huber, and K. A. Moler, Physical Review Letters Vol. 97, December 8, 237002

On the other hand, for the detection, there are disclosed a method for detecting generation of fractional flux created by a soliton, as disclosed in the above-described Documents 1, 2, and 3, and a method for detecting a soliton by generation of a voltage by the annihilation of a soliton-antisoliton pair or by a voltage generated when a soliton is created at a current introduction terminal, as acknowledged in the above-described Document 4. For a promising means for measuring magnetic flux smaller than unit quantum flux, there is also a detection method using a SQUID microscope such as that disclosed in the following Document 7.

Document 7: "SQUID Microscope" Toshimitsu Morooka, Kazuo Chinone, Japanese Journal of Applied Physics, Vol. 70, No. 1 (2001), pp. 50-52

When solitons are used as signal carriers (logic bits) to implement various logical operation functions, etc., control of solitons requires an external magnetic field in the conventional way of thinking. However, since a soliton does not directly interact with a magnetic field, control by an external magnetic field requires a circuit configuration therefor, which conversely causes a drawback that the circuit configuration is susceptible to an environmental magnetic field. Primarily, solitons receive attention because they have the property of not interacting with a magnetic field, which is acknowledged as an advantageous point in application to quantum computers. Thus, there is a contradiction in the conventional techniques that require the setting of a boundary condition by a magnetic field. In addition, even in an attempt to perform control of solitons by an external magnetic field, there are no techniques found to completely control solitons having high energy.

The present invention is made in view of this point, and an object of the present invention is therefore to propose a control method in which solitons can be controlled in accordance with a new control idea without the need to use an external magnetic field and thus naturally without being adversely affected by noise which an environmental magnetic field causes, and a circuit device therefor.

DISCLOSURE OF THE INVENTION

To attain the above-described object, in the present invention, as a new idea, splitting or fusion is used which is brought about by the interaction between solitons themselves without the need for application of external energy, such as an external magnetic field. That is, there is proposed a method for controlling inter-component phase difference solitons, including: allowing the soliton being able to exist in a superconducting environment to propagate through a main line by using a line structure in which a soliton propagation line through which the soliton can travel is divided into a plurality of branch lines at least at a branch end set in a middle of the line, and allowing an inter-component phase difference soliton present in the main line which is an undivided (before divided) line portion to be split and to enter the plurality of branch lines without a supply of external energy, or fusing together inter-component phase difference solitons present in the respective branch lines without a supply of external energy.

On the basis of fulfilling such a basic composition requirement, according to the present invention, there is also proposed the method for controlling inter-component phase difference solitons in which by selectively making at least one of the inter-component phase difference solitons split into the plurality of branch lines disappear, whereby other inter-component phase difference solitons are selectively allowed to remain in corresponding branch lines through which the other inter-component phase difference solitons travel.

With the above-mentioned configuration requirements being met, the lengths of a plurality of branch lines can also be made different from each other. A plurality of solitons which has returned to a branch end where a main line is branched into the branch lines can also be allowed to propagate through the main line again once every numbers of back-and-forth movements of the respective solitons present in the respective branch lines, wherein the numbers of back-and-forth movements are determined by a ratio between the lengths of the plurality of branch lines.

The method for controlling inter-component phase difference solitons further can includes under circumstances where the soliton is present in at least one of the branch lines, selectively injecting the soliton into one or plurality of other branch lines, whereby an inter-component phase difference soliton which is a result of fusion is selectively sent into the main line only at the time of injecting the soliton.

According to an aspect of the present invention, amplification or attenuation of the energy of a soliton can also be performed. As with the previous case, by making a soliton having entered at least one branch line disappear and injecting, instead, a soliton having a higher energy than the disappeared soliton into the same branch line, the energy of a soliton that passes the branch end and enters the main line can be increased over an original soliton that has entered the branch lines. In contrast, by injecting a soliton having a lower energy than the disappeared soliton, the energy of a soliton that passes the branch end and enters the main line can be reduced to less than the energy of an original soliton that has entered the branch lines.

In the present invention, soliton control also using a tunneling phenomenon can be performed. The main line is configured as a barrier line portion, a plurality of branch lines are provided at each end of the main line, and control can be performed such that solitons present in the branch lines are allowed to tunnel through the barrier line portion with a probability that the solitons coincide with each other at a branch end between the main line and the branch lines. In this case, by placing solitons of which number is different from others, in one line or plural lines of the branch lines, a tunneling probability can also be controlled.

By making the number of the branch lines different between on a one end side of the barrier line portion and on an other end side, a soliton whose energy is amplified can also be sent into the branch lines on the side which has a smaller number of the branch lines after the tunneling.

Furthermore, according to a specific aspect of the present invention, by branching a branch line at the branch end from the main line and thereafter, with this branch end being a first branch end, connecting the branch line to the main line again at a second branch end located in a different position from the first branch end, and making a line length of the branch line longer than a length of a main line portion between the first and second branch ends so that a through-hole is made surrounded by the branch line and the main line portion between the first and second branch ends, and by allowing solitons which are split at the first branch end from the main line to enter the branch line and the main line portion between the first and second branch ends, respectively, and allowing the soliton which has entered the main line portion to pass the second branch end first, fractional flux is generated in the through-hole and thus information can be stored.

The present invention can also be provided as a circuit device for implementing a soliton control method such as that described above. That is, as the most basic circuit device, there can be proposed a soliton circuit device including: at least a line structure in which a soliton propagation line through which an inter-component phase difference soliton being able to exist in a superconducting environment can travel is divided into a plurality of branch lines at a branch end set in a middle of the line.

In addition to this basic structure, a circuit device in which the branch lines are also provided with a soliton elimination circuit device that can selectively make a soliton which has entered the branch lines disappear can also be proposed. For the soliton elimination circuit device, a Josephson junction can also be used. In addition, in the present invention, a soliton circuit device in which the lengths of a plurality of branch lines differ from each other can also be proposed.

In another aspect of the present invention, a circuit device in which the main line is configured as a barrier line portion that allows a soliton to tunnel therethrough, and a plurality of branch lines are provided at each end of the main line can also be proposed.

Further, according to the another aspect of the present invention, there is also provided a circuit device in which after the branch line is branched in a middle of a length of the main line with the branch end being a first branch end, the branch line is configured to be connected to the main line again at a second branch end located in a different position from the first branch end, and a line length of the branch line is longer than a length of a main line portion between the first and second branch ends, whereby a through-hole is made surrounded by the branch line and the main line portion between the first and second branch ends.

EFFECT OF THE INVENTION

According to the present invention, since various logical operation functions can be implemented by the interaction between a plurality of solitons without the need for an external magnetic field, noise-resistant control of soliton by an extremely simple circuit device can be performed. In superconducting electronics technology such as quantum computers which are highly resistant to environmental noise, the present invention proposes an extremely practical basic control technique and control circuit structure for the future, and thus, is highly significant in terms of contributing to the relevant technical field.

BEST MODE FOR CARRYING OUT THE INVENTION

Figure 1A:
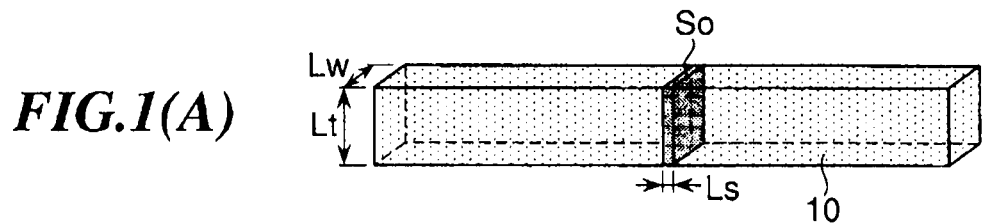
FIG. 1(A) is an illustrative diagram of a soliton present in a one-dimensional soliton propagation line.

FIGS. 1(A) to 1(E) are illustrative diagrams for basic understanding of the present invention, and show a preferred embodiment of a soliton circuit device to which the present invention is applied. Note that throughout the drawings including FIG. 2 and subsequent figures, the same reference numerals denote the same or like components.

As already known, a soliton So (which is hereinafter simply abbreviated as a "soliton" according to the previously described rule but, to be precise, indicates an "inter-component phase difference soliton") is a nonlinear wave that propagates in a one-dimensional soliton propagation line 10 in a superconducting environment such as that shown in FIG. 1(A), without changing its properties such as shape and speed, and is stable for mutual collisions, and has the property of maintaining the soliton's own individuality, and a phase difference between two superconducting components present on two bands serves as a medium carrying the wave of the soliton.

Namely, the soliton So dealt with in the specification belongs to a "topological soliton" and also has geometrical properties, and a phase difference $\Theta_{soliton}$ occurs at the front and back of the soliton So. It is to be noted that the phase difference $\Theta_{soliton}$ is a phase difference occurring between different positions and thus is different from an inter-component phase difference (or interband phase difference) defined in the same position. In propagation or reflection of the soliton So, there is a requirement that the phase difference $\Theta_{soliton}$ be maintained. In other words, if there is a phase difference $\Theta_{soliton}$ there is also a rest state.

The soliton So has a length Ls in a propagation direction and can be considered as a "wall" located between both ends of the soliton propagation line 10. The width of the wall is a width Lw of the propagation line 10. The static energy of this "phase difference soliton wall So", so to speak, is proportional to the width Lw of the wall and is also proportional to a thickness Lt of the line 10. That is, the static energy is proportional to a cross section S (=Lw·Lt) of the propagation line 10. Note that in principle the shape of the cross section is not limited to a rectangular shape and any shape can be taken, in which case the fact remains that the static energy of the soliton is proportional to the cross section S.

When the static energy of the soliton So present in a propagation line having a unit cross section is $E_0$, the static energy of the soliton So present in a circuit with the cross section S is represented as $E_0 \times S$. When the soliton So makes a movement, kinetic energy is added thereto and thus the overall energy of the phase difference soliton making a movement at a velocity v is represented as $E_0 \times S \times (1-(v/c)^2)^{1/2}$, where c is the maximum velocity of the soliton So and is a constant specific to a material composing the propagation line 10.

Note that the soliton propagation line 10 can be typically configured as a multi-band superconducting line; however, nowadays, it is found that, as disclosed in the following Document 8, etc., a multi-component superconducting line which is implemented by a multilayer structure of thin films thinners than the magnetic field penetration depth in real space may also be used. In a similar way, the following description made in the specification can also be applied to the above-mentioned.

Document 8: "Phase Textures Induced by dc-Current Pair Breaking Weakly Coupled Multilayer Structures and Two-Gap Superconductors", A. Gurevich and V. M. Vinokur, Physical Review Letters Vo. 97, September 29, 137003

Figure 1B:
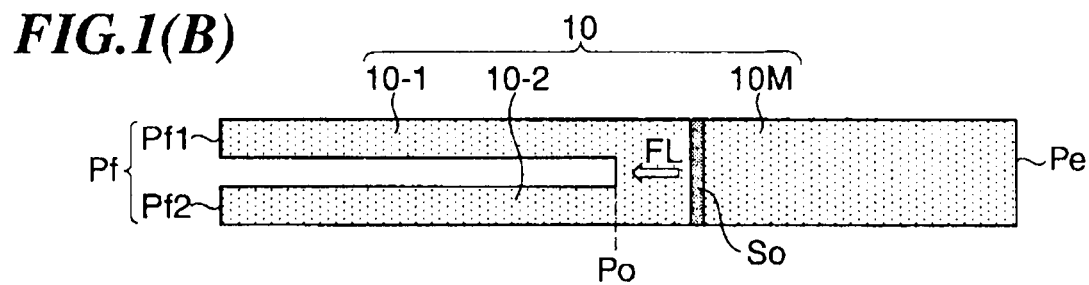
FIG. 1(B) is a schematic configuration diagram of a circuit device in a first embodiment of the present invention.
Figure 1C:
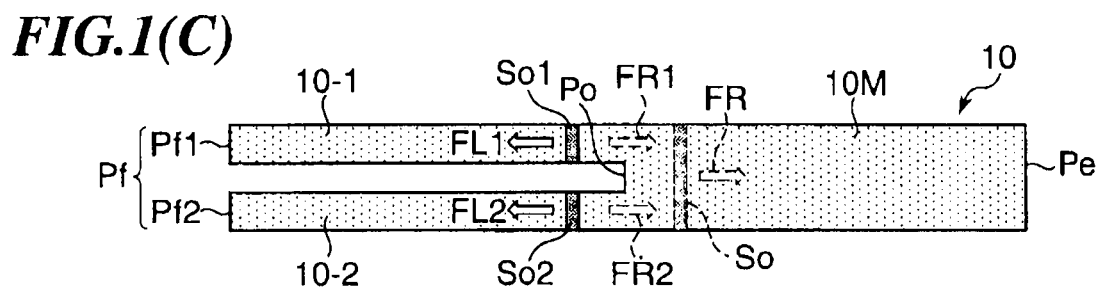
FIG. 1(C) is an illustrative diagram of splitting of a soliton in the circuit device shown in FIG. 1(B).

Now, taking a look at FIGS. 1(B) and 1(C), they show a line structure required for splitting of a soliton So. By the knowledge of the inventors, it has been found that the line structure allows the soliton So to be split without a supply of external energy. A soliton propagation line 10 extends from one end Pe to the other end Pf. With the middle of the length of the soliton propagation line 10 being a branch end Po, the soliton propagation line 10 is divided into a plurality of lines from the branch end Po to the other end Pf, i.e., two branch lines 10-1 and 10-2 in the case of the drawings. An undivided portion of the line from the one end Pe to the branch end Po is called a main line 10M for the sake of convenience. In other words, the line structure is such that the two branch lines 10-1 and 10-2 extend out to be branched from one end of the main line 10M with their own continuity being maintained. This circuit device is shown in FIG. 1(B) and subsequent figures.

In such a soliton propagation line 10, a soliton So having traveled through the main line 10M from the side of the one end Pe in a direction indicated by an arrow FL is, as shown in FIG. 1(C), split into two solitons when passing the branch end Po. The two solitons enter straight into the branch lines 10-1 and 10-2, respectively, and can thereafter continuously travel to other ends Pf1 and Pf2 of the respective branch lines, as shown by arrows FL1 and FL2. This does not require a supply of external energy. Such the operation and a phenomenon obtained by the knowledge of the inventors extremely effectively work upon performing various logic functions.

Similarly, according to the knowledge of the inventors, it has been found that an opposite process to the above-described soliton splitting, i.e., a soliton fusion process, can also be considered without a supply of external energy. In FIG. 1(C), when solitons So1 and So2 present in the branch lines 10-1 and 10-2, respectively, move from the left to the right in the drawing, as shown by virtual-line arrows FR1 and FR2, and reach the branch end Po at the same timing and the sum of the energies of the two solitons So1 and So2 is greater than or equal to a magnitude at which the soliton So can exist in the main line 10M, the two solitons So1 and So2 are fused into one soliton So again and the soliton So can move through the main line 10M in a direction of an arrow FR. In this case, the branch end Po may be called a merging end Po. If both ends Pe and Pf of the soliton propagation line 10 are closed, then the soliton So is reflected by an each end portion and moves back and forth while repeating the above-described splitting and fusion.

Note that the structure in which the main line 10M and the branch lines 10-1 and 10-2 "maintain their own continuity" in the above description indicates that the connection relationship between the main line 10M and the branch lines 10-1 and 10-2 satisfies a connection relationship that allows such splitting and fusion of the soliton So without inhibition. In practice, forming the branch lines 10-1 and 10-2 is easy and common by cutting and dividing one transmission line 10 which is uniform in terms of physical properties, halfway down in a length direction.

Figure 1D:
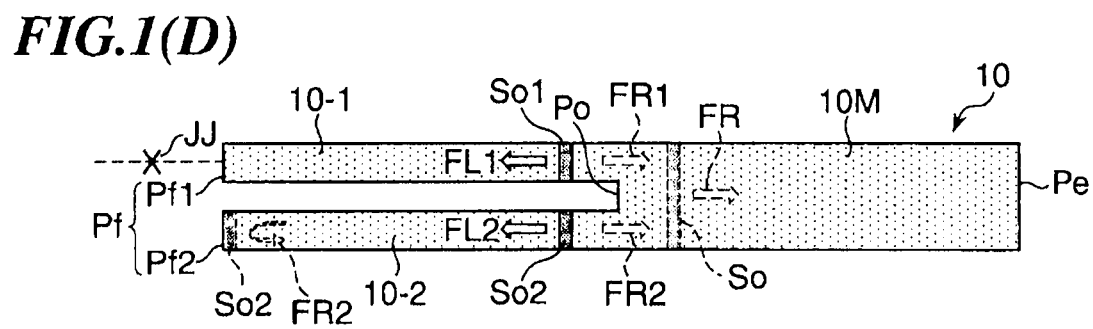
FIG. 1(D) is an illustrative diagram of back-and-forth movements of one soliton split by the circuit device shown in FIG. 1(B).

In such a line structure, for example, the following control of a soliton So can be performed. As described in line with FIG. 1(C), it is assumed that a soliton So which has traveled through the main line 10M is split into two solitons at and after the branch end Po, and the two solitons are allowed to travel through the branch lines 10-1 and 10-2 to the other ends Pf1 and Pf2 of the respective branch lines, as shown by the arrows FL1 and FL2, respectively, and thereafter, for example, as shown in FIG. 1(D), a soliton So1 having moved to the upper branch line 10-1 can be guided straight to a soliton elimination circuit device, such as a Josephson junction JJ, to destroy and eliminate the soliton So1 there. In that case, even when a soliton So2 traveling through the lower branch line 10-2 is reflected by the end portion Pf2, as shown by the arrow FR2, and returns to the side of the branch end Po, the soliton So2 alone has insufficient energy and thus can no longer enter the main line 10M. As a result, the soliton So2 only moves back and forth through the lower branch line 10-2 and thus remains confined there.

Therefore, by forming a quantum bit structure disclosed in previously listed Document 2, etc., in the lower branch line 10-2, a quantum bit is allowed to function by sending one soliton So2 into the lower branch line 10-2. Note that, for the soliton elimination circuit device, a Josephson junction JJ is used and the fact that a soliton can be destroyed and made to disappear by the Josephson junction JJ is disclosed in the following Document 9 related to an application of the applicants of the present invention.

Document 9: Japanese Patent Application Laid-Open No. 2008-053597

The number of branch lines is not limited to two; when a plurality of branch lines are provided, by selectively making a soliton traveling through at least one of the branch lines disappear, the same function as that described above can be performed.

Figure 1E:
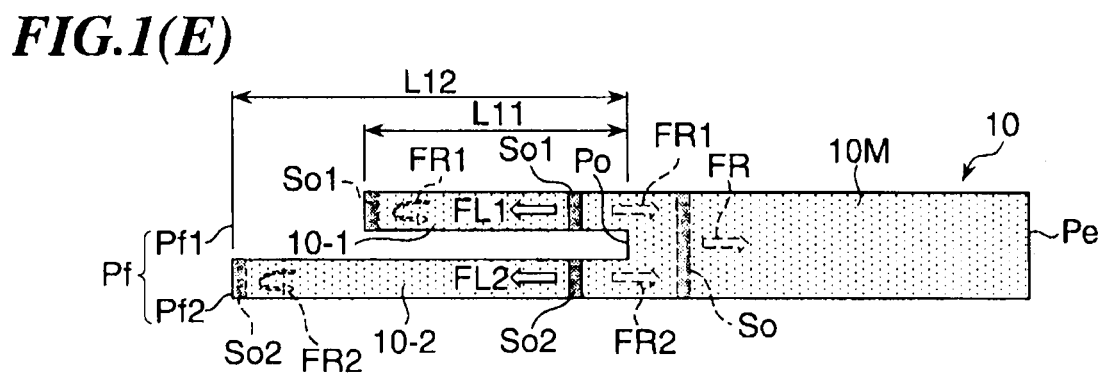
FIG. 1(E) is an illustrative diagram of the behavior of solitons when the lengths of a pair of branch lines are made different in the circuit device shown in FIG. 1(B).

As shown in FIG. 1(E), by making a length L11 of the upper branch line 10-1 and a length L12 of the lower branch line 10-2 different, the following peculiar and useful operation can also be expected. Solitons So1 and So2 present in the branch lines 10-1 and 10-2, respectively, are reflected by their corresponding other ends Pf1 and Pf2 of the branch lines, as shown by the arrows FR1 and FR2, and are also reflected by the branch end Po to which they have moved. After all, the solitons So1 and So2 move back and forth in the branch lines 10-1 and 10-2, respectively. However, since the upper and lower branch lines 10-1 and 10-2 have different lengths L11 and L12, the two solitons So1 and So2 do not always positionally coincide with each other at the branch end Po exactly at the same time. Only every number of times of back-and-forth movements determined by the ratio L11/L12 between the lengths of the branch lines 10-1 and 10-2, the two solitons So1 and So2 which have returned to the branch end Po positionally coincide with each other at the same timing. Only at that time, the solitons So1 and So2 are fused together without receiving a supply of external energy and can go back into the main line 10M again. This turns out to be the construction of a digital delay circuit and indicates that the delay time can be arbitrarily set depending on the setting of the length ratio L11/L12. When there are a plurality of branch lines, more complex delay control can also be performed.

Figure 2A:
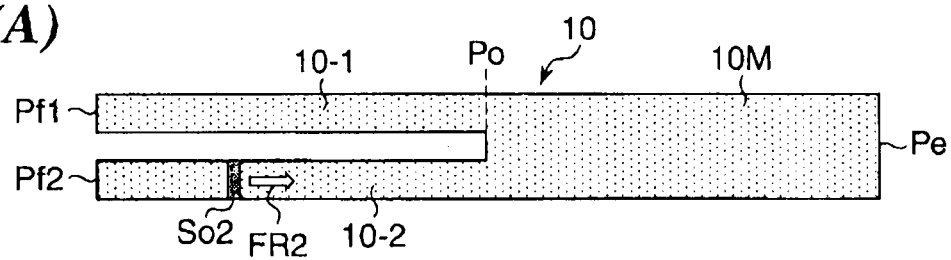
FIG. 2(A) is an illustrative diagram of when a soliton is present only in one branch line.
Figure 2B:
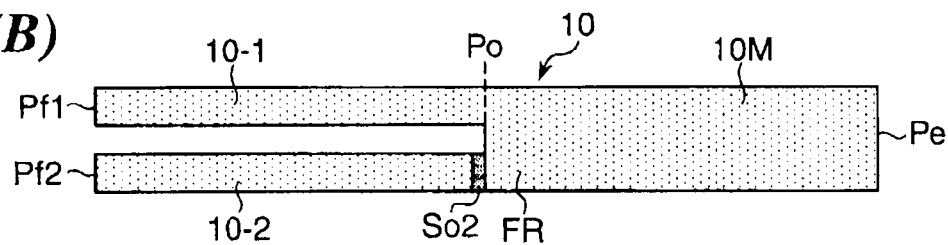
FIG. 2(B) is an illustrative diagram of a state in which the soliton shown in FIG. 2(A) reaches a branch end.
Figure 2C:
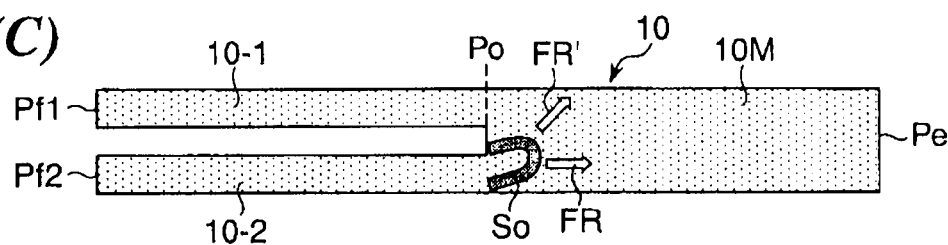
FIG. 2(C) is an illustrative diagram of an aspect that the soliton which has reached the branch end is expanding.
Figure 2D:
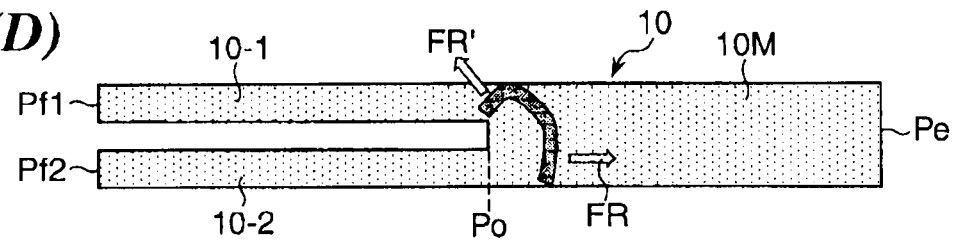
FIG. 2(D) is an illustrative diagram of the circumstances where the soliton which has reached the branch end is further expanding.

Here, we think about a state in which, as shown in FIG. 2(A), a soliton So2 travels only in one branch line, e.g., the lower branch line 10-2 in the drawing. In order for the soliton So2 to move in a direction of an arrow FR2, reach the branch end Po as shown in FIG. 2(B), and further pass the branch end Po and enter the main line 10M and keep moving, as shown in FIGS. 2(C) and 2(D), the soliton wall needs to be expanded and deformed temporarily into one that moves in an upward direction FR' and rightward FR. This is because the requirement (geometrical or topological constraint) that a phase difference $\Theta_{soliton}$ needs to be present at the front and back of the soliton wall should be fulfilled.

Figure 2E:
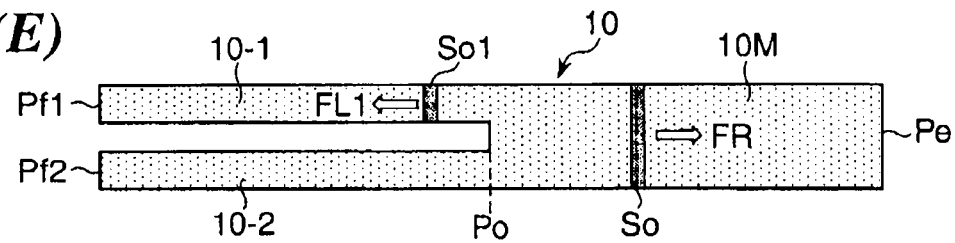
FIG. 2(E) is an illustrative diagram of when a moving soliton also occurs in an upper branch line.
Figure 2F:
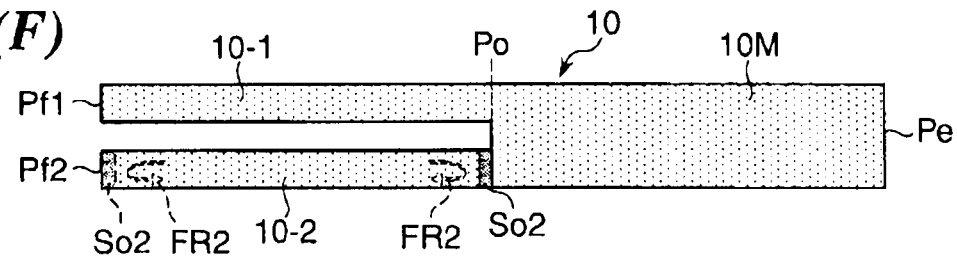
FIG. 2(F) is an illustrative diagram of a soliton that cannot get out of a lower branch line.

If the energy of the soliton So2 is of sufficient magnitude, then the soliton So2 transitions from a state of FIG. 2(D) to a state shown in FIG. 2(E), and is split into a soliton So that moves through the main line 10M and a soliton So1 that moves through the upper branch line 10-1 and the soliton So and the soliton So1 can travel through their respective lines. If, on the other hand, the energy of the soliton So2 present in the lower branch line 10-2 is not sufficient, then, as described previously, the soliton So2 cannot get out of the lower branch line 10-2. Thus, as shown in FIG. 2(F), the soliton So2 just repeats reflection such that the soliton So2 goes in a direction of an arrow FR2 and back in a direction of an arrow FL2 again and again between the branch end Po and the other end Pf2.

Figure 3:
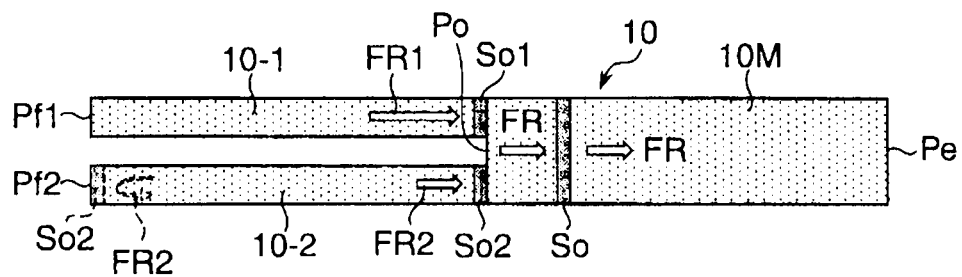
FIG. 3 is an illustrative diagram of when, with a soliton being allowed to travel through one branch line in advance, a soliton is selectively injected into the other branch line.

However, by using this phenomenon, control that is described in line with FIG. 3 can be performed. As described above, in a state described in line with FIG. 2(F), i.e., in a state in which there is a soliton So2 confined only in the lower branch line 10-2, a soliton So1 that reaches the branch end Po at the same time as the soliton So2 traveling through the lower branch line 10-2 in the direction of the arrow FR2 is selectively injected into the upper branch line 10-1 and the energy of the injected soliton So1 is set such that the sum of the energies of the two solitons So1 and So2 is greater than or equal a magnitude at which a soliton So can exist in the main line 10M at or after the branch end Po, whereby the soliton So that can be used as a logic signal carrier can be intentionally allowed to exist or not in the main line 10M, depending on whether the soliton So1 is injected into the upper branch line 10-1.

Accordingly, in this case, the soliton So1 present in the upper branch line 10-1 controls the propagation and movement of the soliton So2 traveling through the lower branch line 10-2, and thus can be used as a trigger signal (control signal or gate signal) for selectively propagating signal information present in the lower branch line 10-2 to a circuit that continues after the main line 10M. On the other hand, considering both of the two solitons So1 and So2 that can selectively exist in the two branch lines 10-1 and 10-2 as signal carriers, it can also be seen that this circuit device can perform an AND function. In this case, too, construction of a plurality of branch lines is also considered; under circumstances where a soliton is present in any one of the branch lines, by selectively injecting a soliton into anyone or plurality of the other branch lines, a soliton which is a result of fusion and serves as signal information can be selectively sent into the main line 10M only at that time, it is possible to perform control of a more complex configuration.

In a circuit device of the present invention, acceleration or deceleration of a soliton So (amplification or attenuation of energy) can also be performed. Going back to the previous drawing, using a circuit device structure in FIG. 1(D) that has a Josephson junction JJ, for example, a soliton So1 which has entered the upper branch line 10-1 is destroyed by the Josephson junction JJ, etc. Instead, as shown in FIG. 3, a soliton So1 having a higher energy (faster) than the destroyed soliton So1 is injected into the upper branch line 10-1 in a direction of an arrow FR1 so as to timingly coincide, at the branch end Po, with a soliton So2 which has traveled through the lower branch line 10-2 in a direction of an arrow FR2, whereby the energy of a soliton So into which the solitons So1 and So2 are fused and which has returned to the main line 10M becomes higher than that of an original soliton So that has traveled toward the branch lines 10-1 and 10-2.

The soliton So having been energetically amplified and entered the main line 10M is allowed to be reflected by one end Pe of the main line 10M and is branched into the branch lines 10-1 and 10-2 again. Then, while the solitons are allowed to repeat the same operation as that described above, a soliton So1 is newly injected into the upper branch line 10-1 per each operation repetition so that the energy of the injected soliton So1 is increased more, whereby the energy of a soliton So present in the main line 10M or a soliton So1 traveling through the lower branch line 10-2 can be gradually increased.

Attenuation of the energy of a soliton So (deceleration of traveling speed) can also be performed. To do so, when in the above description a soliton So1 is newly injected into the upper branch line 10-1, the soliton So1 is allowed to have a lower energy than a soliton So1 which has been made to disappear by the Josephson junction JJ.

It is also possible that a difference is made in cross section between the upper branch line 10-1 and the lower branch line 10-2 to cause a difference in energy between solitons So1 and So2 that travel therethrough. Thus, for example, by increasing the cross section of the upper branch line 10-1, the degree of acceleration or deceleration of the soliton So2 traveling through the lower branch line 10-2 at the time that a soliton with the same speed is injected can also be adjusted.

Figure 4A:
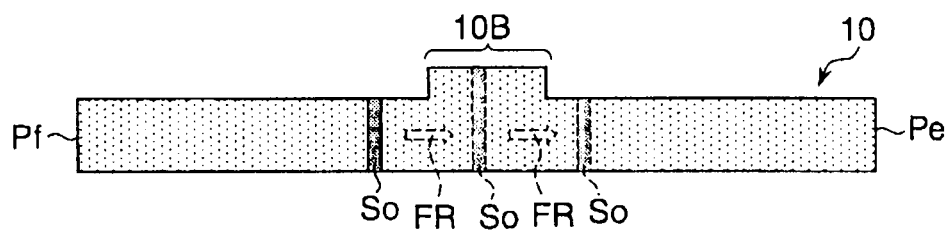
FIG. 4(A) is a schematic configuration diagram of a line structure in another embodiment of the present invention.

In the present invention, soliton control using a tunneling phenomenon can also be performed. First, a line structure of a configuration such as that shown in FIG. 4(A) is considered. Specifically, the cross section of a portion of a soliton transmission line 10 at the midpoint in a length direction thereof is increased over a predetermined length, forming a barrier line portion 10B. The barrier line portion 10B is configured to have insufficient energy to create a soliton.

Despite this, by setting parameters, such as the cross section and length of the barrier line portion 10B and the energy of a traveled soliton So, to meet specific conditions, a tunneling phenomenon can be brought about in which a soliton So located in a line portion on the left side of the barrier line portion 10B in the drawing passes through the barrier line portion 10B in a direction of an arrow FR and reaches a line portion on the right side. In this case, since the tunneling phenomenon occurs by a secondary perturbation process, the tunneling probability is roughly inversely proportional to the square of the difference between the energy of the soliton So and the energy required to create a soliton in the portion of the barrier line portion 10B.

Figure 4B:
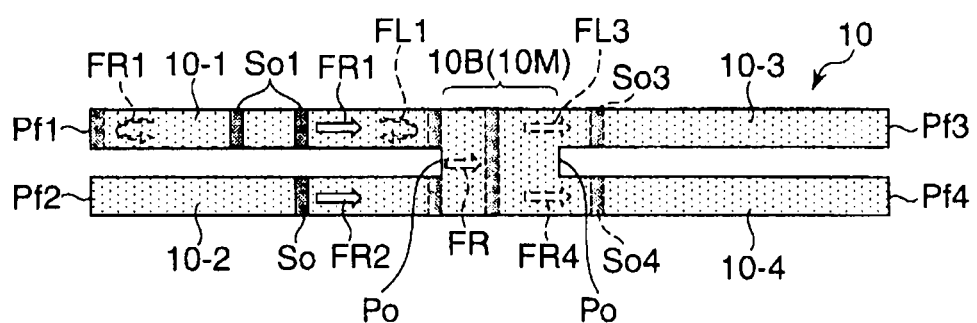
FIG. 4(B) is an illustrative diagram of a modification example of the line structure shown in FIG. 4(A).

Hence, for example, as shown in FIG. 4(B), a soliton propagation line 10 in which upper and lower branch lines 10-1 and 10-2; and 10-3 and 10-4 are respectively connected to both ends of a barrier line portion 10B is constructed. From the viewpoint of only a structural comparison, the main line 10M of the soliton propagation line 10 shown in FIGS. 1 to 3 can be considered as the barrier line portion 10B in this embodiment. Although in the line structure described so far a pair of branch lines 10-1 and 10-2 are connected only to a one-end side of the main line 10M, in the embodiment shown in FIG. 4(B) the line structure can be considered as one in which pairs of branch lines 10-1 and 10-2; and 10-3 and 10-4 are connected to both-end sides, respectively. Note that in the drawing reference numerals Pf3 and Pf4 are also respectively appended to the free end portions of the branch lines 10-3 and 10-4 on the right side.

In such a line structure, when a soliton So1 is placed in the upper branch line 10-1 on the left side in the drawing, the tunneling probability of solitons passing the barrier line portion 10B is proportional to the probability that upper and lower solitons So1 and So2 positionally coincide with each other at a branch end Po on the left side, and is inversely proportional to the square of the difference between the overall energy of a soliton So created by fusion and the energy required to create a soliton So in the barrier line portion 10B. Therefore, for example, when some solitons So1 are placed in advance in the upper branch line 10-1 on the left side, the probability that solitons merge together while temporally coinciding with each other at the branch end Po increases by the number of the solitons So1 placed in the branch line 10-1. This turns out to indicate that the tunneling probability can be controlled without a supply of external energy to cause tunneling.

A soliton So which has tunneled through the barrier line portion 10B can, of course, go to the branch lines 10-3 and 10-4 on the right side separately in a branched manner and can travel as individual solitons So3 and So4. But if only one branch line of branch lines 10-3 and 10-4 on the right side is present, then a soliton So traveling therethrough can be one with increased energy or one travelling at high speed. That is, this serves as a circuit device in which, as is the above-described case, a supply of external energy is not required to cause tunneling and energy amplification is achieved while the tunneling probability is arbitrarily controlled. In this case, only one of the branch lines 10-3 and 10-4 present can be considered as the main line 10M. Namely, a circuit device structured in such the manner can be considered to have a structure in which the pair of branch lines 10-1 and 10-2 are connected to the main line 10M with the barrier line portion 10B provided therebetween. In any of the cases, as is the previous case, in principle, the number of branch lines can be set to any value, and by the same operating principles tunneling phenomenon control with a wider selection range and a higher degree of freedom can be performed. For amplification, too, if different numbers of branch lines are connected on both-end sides of the barrier line portion 10B, then a soliton sent after tunneling into the branch lines of the end side which has the smaller number of the branch lines result in the amplified energy of the soliton.

FIGS. 5(A) to 5(D) show a still another embodiment according to the present invention. Taking a structural look, this soliton propagation line 10 has a branch line 10-1 that branches at a branch end Po, in the middle of a length extending from one end Pe to the other end Pf of a main line 10M. The branch line 10-1 is connected again to the main line 10M at a second branch end Po' which is located in a different position from the branch end Po and is located nearer the side of the other end Pf of the main line 10M, and serves as a substantial alternative line having a longer line length than the length of a main line portion between the pair of branch ends Po and Po'. Taking another structural look, the portion of the main line 10M between the pair of branch ends Po and Po' can be considered as a second branch line 10-2 which has been described so far, or can also be considered to have a form such that two soliton propagation lines 10 shown in FIGS. 1(B) to 1(D), 2, and 3 are used and the soliton propagation lines 10 are allowed to face each other on the sides of the respective free ends Pf1 and Pf2: and Pf1 and Pf2 of branch lines 10-1 and 10-2; and 10-1 and 10-2, and are joined together at the free ends Pf1 and Pf2; and Pf1 and Pf2.

A characteristic of the structure is that, since the branch line 10-1 serving as the alternative line 10-1 is longer than the main line portion between the pair of branch ends Po and Po' which corresponds to the second branch line 10-2, a through-hole HL is made surrounded thereby. As a result, as will be described below, control using fractional flux $\Phi_{fractional}$ can be implemented.

Figure 5A:
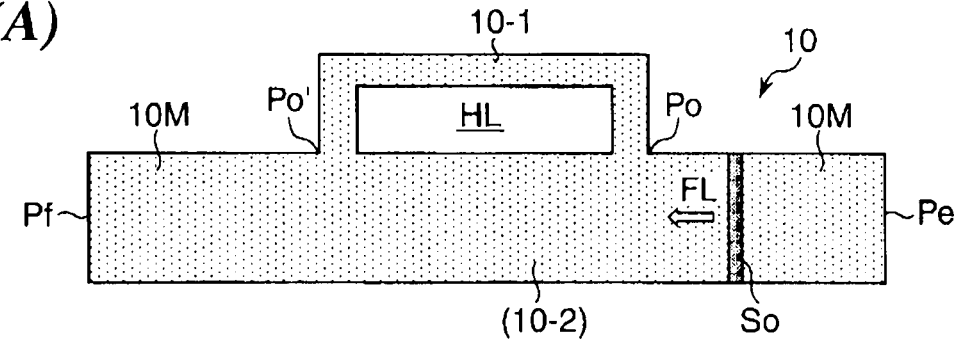
FIG. 5(A) is a schematic configuration diagram of a line structure in a still another embodiment of the present invention.
Figure 5B:
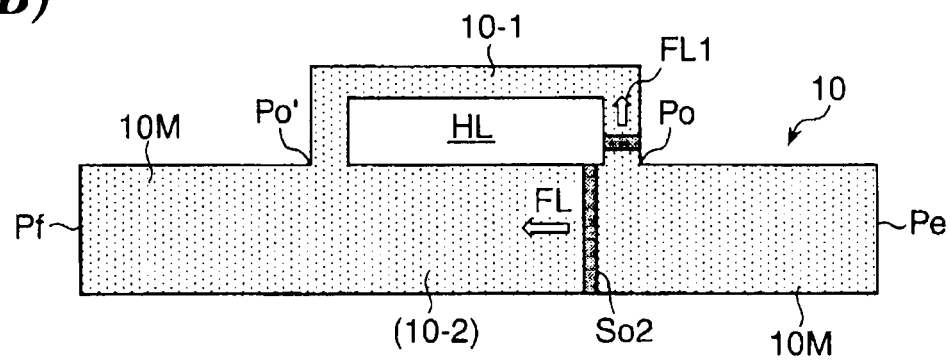
FIG. 5(B) is an illustrative diagram of when a soliton has reached a first branch end in the line structure shown in FIG. 5(A).

As shown in FIG. 5(A), it is assumed that a soliton So enters the main line 10M from the right end Pe in the drawing and moves in a direction of an arrow FL. As shown in FIG. 5(B), the soliton So soon reaches the first branch end Po and is split at the first branch end Po, as shown by arrows FL1 and FL2, without supplying energy externally, and is separated into a soliton So1 that moves in a direction of the first branch line 10-1 and a soliton So2 that moves through the main line 10M or the second branch line 10-2.

Figure 5C:
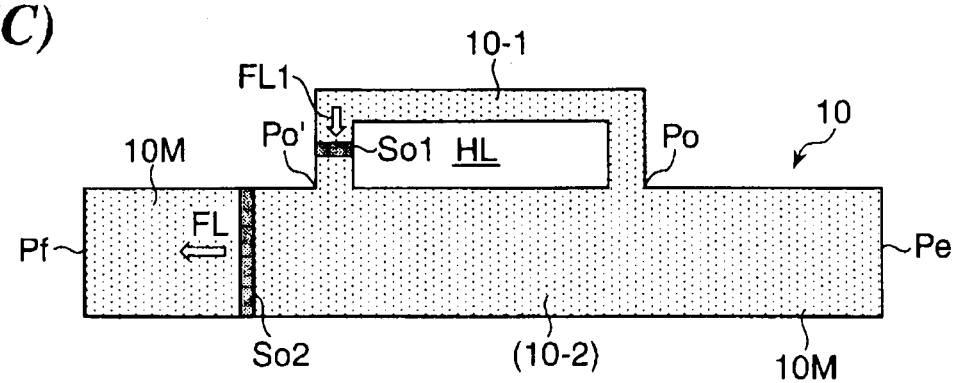
FIG. 5(C) is an illustrative diagram of a scene in which one of a pair of solitons has passed a second branch end first.
Figure 5D:
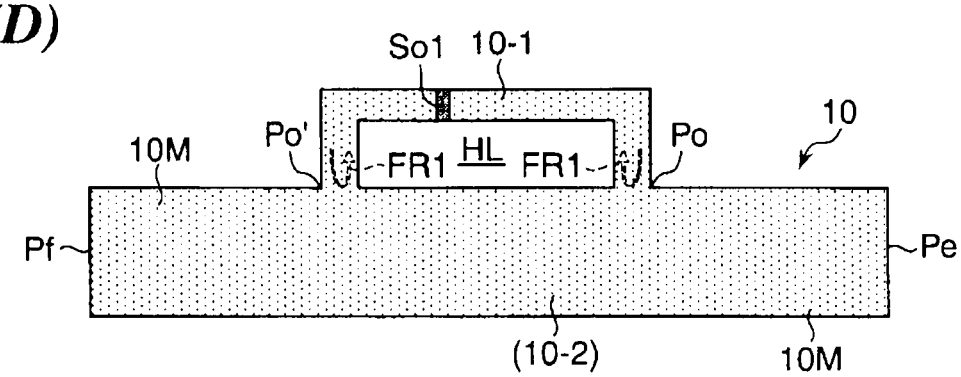
FIG. 5(D) is an illustrative diagram showing the circumstances where one soliton cannot get out of a first branch line.

However, as described previously, since the line length of the first branch line 10-1 is longer than that of the main line portion between the pair of branch ends Po and Po' (second branch line 10-2), as shown in FIG. 5(C), when the lower soliton So2 has sufficient energy, the soliton So2 present in the main line portion passes the second branch end Po' first. As a result, fractional flux $\Phi_{fractional}$ occurs in the through-hole HL.

The reason that fractional flux $\Phi_{fractional}$ thus occurs in the through-hole HL is to compensate for a quantum phase shift caused by the soliton So1 remaining in the upper branch line 10-1, i.e., a phase difference $\Theta_{soliton}$, as shown in FIG. 1(D). Therefore, when the soliton So1 present in the upper branch line 10-1 does not have sufficient energy to pass the second branch end Po' and further go through the main line 10M to the left, or does not have energy required for the soliton So1 to be reflected, as shown by an arrow FR1, to get away from the through-hole HL and to return to the mainline 10M nearer the right side in relation to the first branch end Po, the soliton So1 cannot get away from the first branch line 10-1 and thus fractional flux $\Phi_{fractional}$ is continuously generated in the through-hole HL.

This turns out that an information storage function is provided. The information storage function being able to be performed without a supply of external energy is extremely advantageous in terms of construction of a digital logic circuit. Note that even when either one of the upper and lower solitons So1 and So2 is allowed to collide with a soliton elimination circuit device, such as a Josephson junction, and is destroyed and either one is allowed to remain around the through-hole HL, likewise, a soliton serving as a stored information unit can be identified by detecting fractional flux $\Phi_{fractional}$.

Note that, as described previously, fractional flux $\Phi_{fractional}$ can be measured by a scanning-type SQUID magnetic flux microscope, or can also be measured by measuring the magnetic field dependence thereof by using an rf-SQUID or a DC-SQUID composed of a through-hole HL itself.

Although the embodiments of a method for controlling interband phase difference solitons according to the present invention have been described above, the present invention is not limited thereto, and needless to say, various modifications may be made within the technical scope as set forth in the claims. As described previously, although the number of branch lines is basically two in the case of the drawings, the number of branch lines can be set to any value and soliton control by using a circuit device with the number of branch lines which is set that way can be no different from that described above in terms of basic operating principles. At any rate, the significance of the present invention is extremely great because the present invention demonstrates that various controls which are essentially required for a digital circuit can be performed only by the interaction between solitons without the need for a supply of external energy.

What is claimed is:

1. A inter-component phase difference soliton circuit device comprising:
a soliton propagation line having a line structure through which an inter-component phase difference soliton can travel, the soliton propagation line including a main line that is divided into a first plurality of branch lines at a branch end set in a middle of a length of the main line, wherein
the inter-component phase difference soliton is able to exist in a superconducting environment,
the main line is configured as a barrier line portion that allows an inter-component phase difference soliton to tunnel therethrough, and
a second plurality of branch lines are provided at each end of the main line.

2. An inter-component phase difference soliton circuit device comprising:
a soliton propagation line having a line structure through which an inter-component phase difference soliton can travel, the soliton propagation line including a main line that is divided into a plurality of branch lines at a branch end set in a middle of a length of the main line, wherein
the inter-component phase difference soliton is able to exist in a superconducting environment,
the plurality of branch lines includes a first branch line and a second branch line,
the first branch line and the second branch line are branched at the branch end being a first branch end of the main line,
the first branch line and the second branch line are configured to be reconnected to the main line at a second branch end located in a different position from the first branch end, and
a line length of the first branch line is longer than a length of the second branch line, the second branch line being between the first and second branch ends, whereby a through-hole is made surrounded by the first branch line and the second branch line between the first and second branch ends.

3. A method for controlling inter-component phase difference solitons, comprising:
allowing an inter-component phase difference soliton to propagate through a soliton propagation line having a line structure in which a soliton propagation line through which the inter-component phase difference soliton can travel, the soliton propagation line including a main line that is divided into a plurality of branch lines at least at a branch end set in a middle of the main line, and the inter-component phase difference soliton being able to exist in a superconducting environment;
allowing the inter-component phase difference soliton present in the main line, which is an undivided line portion of the soliton propagation line, to be split into a plurality of inter-component phase different solitons and to enter the plurality of branch lines without a supply of external energy, or fusing together the plurality of inter-component phase difference solitons present in the respective branch lines without a supply of external energy;
making a length of each branch line of the plurality of branch lines to be different from lengths of the other respective branch lines of the plurality of branch lines; and
allowing the plurality of inter-component phase difference solitons having returned to the branch end to propagate through the main line again only a number of times of back-and-forth movements of the respective inter-component phase difference solitons present in the respective branch lines, wherein
the number of times of back-and-forth movements is determined by a ratio between the lengths of the plurality of branch lines.

4. A method for controlling inter-component phase difference solitons, comprising:
allowing an inter-component phase difference soliton to propagate through a soliton propagation line having a line structure in which a soliton propagation line through which the inter-component phase difference soliton can travel, the soliton propagation line including a main line that is divided into a plurality of branch lines at least at a branch end set in a middle of the main line, and the inter-component phase difference soliton is able to exist in a superconducting environment;
allowing the inter-component phase difference soliton present in the main line, which is an undivided line portion of the soliton propagation line, to be split and to enter the plurality of branch lines without a supply of external energy, or fusing together inter-component phase difference solitons present in the respective branch lines without a supply of external energy; and
when a first inter-component phase difference soliton is present in at least one of the branch lines, selectively injecting a second inter-component phase difference soliton into one or more other branch lines of plurality of other branch lines, wherein
the first inter-component phase difference soliton is selectively sent into the main line only at the time of injecting the second inter-component phase difference soliton.

5. A method for controlling inter-component phase difference solitons, comprising:
allowing an inter-component phase difference soliton to propagate through a soliton propagation line having a line structure in which a soliton propagation line through which the inter-component phase difference soliton can travel, the soliton propagation line including a main line that is divided into a plurality of branch lines at least at a branch end set in a middle of the main line, and the inter-component phase difference soliton is able to exist in a superconducting environment;
allowing a first inter-component phase difference soliton present in the main line, which is an undivided line portion of the soliton propagation line, to be split into at least one split inter-component phase difference soliton and the at least one split inter-component phase difference soliton to enter the plurality of branch lines without a supply of external energy, or fusing together a plurality of inter-component phase difference solitons present in the respective branch lines without a supply of external energy;
making the at least one split inter-component phase difference soliton, which has entered at least one of the branch lines, disappear; and
injecting a second inter-component phase difference soliton, having a higher energy than an energy of the at least one split inter-component phase difference soliton, into the same branch line that the at least one split inter-component phase difference soliton entered, the energy of the second inter-component phase difference soliton is increased, when compared to the energy of the at least one split inter-component phase difference soliton, when the second inter-component phase difference soliton passes the branch end and enters the main line from the at least one of the branch lines, or injecting a third inter-component phase difference soliton, having a lower energy than the energy of the at least one split inter-component phase difference soliton, into the same branch line that the at least one split inter-component phase difference soliton entered, the energy of the third inter-component phase difference soliton is reduced, when compared to the energy of the at least one split inter-component phase difference soliton, when the third inter-component phase difference soliton passes the branch end and enters the main line from the at least one of the branch lines.

6. A method for controlling inter-component phase difference solitons, comprising:
allowing an inter-component phase difference soliton to propagate through a soliton propagation line having a line structure in which a soliton propagation line through which the inter-component phase difference soliton can travel, the soliton propagation line including a main line that is divided into a plurality of branch lines at least at a branch end set in a middle of the main line, and the inter-component phase difference soliton is able to exist in a superconducting environment;
allowing the inter-component phase difference soliton present in the main line, which is an undivided line portion of the soliton propagation line, to be split into a plurality of inter-component phase difference solitons and to enter the plurality of branch lines without a supply of external energy, or fusing together the plurality of inter-component phase difference solitons present in the respective branch lines without a supply of external energy;
configuring the main line as a barrier line portion;
providing the plurality of branch lines at each end of the main line; and
allowing the plurality of inter-component phase difference solitons present in the branch lines to tunnel through the barrier line portion at a tunneling probability that the plurality of inter-component phase difference solitons coincide with each other at a branch end between the main line and the branch lines.

7. The method for controlling inter-component phase difference solitons according to claim 6, further comprising:
controlling the tunneling probability by placing the plurality of inter-component phase difference solitons, of which number is different from other branch lines, into one or more branch lines of the plurality of the branch lines.

8. The method for controlling inter-component phase difference solitons according to claim 6, further comprising:
making a first number of branch lines of the plurality of branch lines at a one-end side of the barrier line portion to be greater than a second number of branch lines of the plurality of branch lines at an other-end side of the barrier line portion; and
amplifying an energy of the inter-component phase difference soliton by sending the inter-component phase difference soliton into the second number of branch lines after the tunneling.

9. A method for controlling inter-component phase difference solitons, comprising:
allowing an inter-component phase difference soliton to propagate through a soliton propagation line having a line structure in which a soliton propagation line through which the inter-component phase difference soliton can travel, the soliton propagation line including a main line that is divided into a plurality of branch lines at least at a branch end set in a middle of the main line, the plurality of branch lines include a first branch line and a second branch line, and the inter-component phase difference soliton is able to exist in a superconducting environment;

allowing the inter-component phase difference soliton present in the main line, which is an undivided line portion of the soliton propagation line, to be split and to enter the plurality of branch lines without a supply of external energy, or fusing together inter-component phase difference solitons present in the respective branch lines without a supply of external energy;

branching the first branch line and the second branch line at the branch end from the main line, the branch end being a first branch end of the main line, connecting the first branch line and the second branch line to the main line again at a second branch end located in a different position from the first branch end;

making a line length of the first branch line longer than a length of the second branch line, the second branch line being between the first and second branch ends, whereby a through-hole is made surrounded by the first branch line and the second branch line between the first and second branch ends;

allowing inter-component phase difference solitons which are split at the first branch end from the main line to enter the first branch line and the second branch line between the first and second branch ends, respectively; and allowing the inter-component phase difference soliton which has entered the second branch line to pass the second branch end first, whereby fractional flux is generated in the through-hole.

* * * * *